(12) United States Patent
Zhang et al.

(10) Patent No.: US 12,298,637 B2
(45) Date of Patent: May 13, 2025

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yadong Zhang, Beijing (CN); Ting Li, Beijing (CN); Chunhua Wang, Beijing (CN); Zheng Liao, Beijing (CN); Ze Zhao, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/260,797

(22) PCT Filed: Jul. 28, 2022

(86) PCT No.: PCT/CN2022/108577
§ 371 (c)(1),
(2) Date: Jul. 10, 2023

(87) PCT Pub. No.: WO2024/020931
PCT Pub. Date: Feb. 1, 2024

(65) Prior Publication Data
US 2024/0385484 A1 Nov. 21, 2024

(51) Int. Cl.
*G02F 1/1333* (2006.01)
*G02F 1/1362* (2006.01)
(Continued)

(52) U.S. Cl.
CPC .... *G02F 1/136286* (2013.01); *G02F 1/13338* (2013.01); *G02F 1/133388* (2021.01);
(Continued)

(58) Field of Classification Search
CPC .......... G02F 1/136286; G02F 1/13338; G02F 1/133388; G02F 1/1368; G06F 3/0412; G06F 3/04166; H01L 27/124
See application file for complete search history.

(56) References Cited

U.S. PATENT DOCUMENTS 10,078,392 B2  9/2018  Huang et al.
10,175,812 B2  1/2019  Ji et al.
(Continued)

FOREIGN PATENT DOCUMENTS

CN  102265245 B  4/2014
CN  106406598 A  2/2017
(Continued)

OTHER PUBLICATIONS

International Search report of PCT/CN2022/108577, which has mailing date on Mar. 28, 2023.

*Primary Examiner* — Antonio Xavier
(74) *Attorney, Agent, or Firm* — Dilworth & Barrese, LLP; Michael J. Musella, Esq.

(57) ABSTRACT

A display substrate and a display device are provided. The display substrate has a display area and a peripheral area surrounding the display area. The display substrate includes a first common voltage line, a second common voltage line and an integrated circuit. The first common voltage line is provided in the peripheral area and at least partially surrounds the display area; the second common voltage line is provided in the peripheral area, located on a side of the first common voltage line away from the display area, and at least partially surrounds the display area; the integrated
(Continued)

circuit is provided in the peripheral area, and located on a first side of the display area, configured to provide first signals to the first and second common voltage line during a display stage, and provide second signals to the first and second common voltage line during a touch stage.

20 Claims, 5 Drawing Sheets

(51) Int. Cl.
    *G02F 1/1368*     (2006.01)
    *G06F 3/041*     (2006.01)
    *H01L 27/12*     (2006.01)

(52) U.S. Cl.
    CPC .......... *G02F 1/1368* (2013.01); *G06F 3/0412* (2013.01); *G06F 3/04166* (2019.05); *H01L 27/124* (2013.01)

(56) References Cited

U.S. PATENT DOCUMENTS

| | | |
|---|---|---|
| 2012/0162134 A1 | 6/2012 | Chen et al. |
| 2016/0139700 A1 | 5/2016 | Wang et al. |
| 2016/0334934 A1 | 11/2016 | Mo et al. |
| 2016/0342277 A1 | 11/2016 | Lu et al. |
| 2017/0031520 A1 | 2/2017 | Kang et al. |
| 2018/0039118 A1 | 2/2018 | Chen et al. |
| 2018/0150166 A1* | 5/2018 | Aoki ..................... G06F 3/0443 |
| 2018/0341365 A1 | 11/2018 | Mo et al. |
| 2019/0014664 A1* | 1/2019 | Ahn ....................... H10K 59/40 |
| 2019/0204942 A1* | 7/2019 | Xu ......................... G06F 3/0443 |
| 2021/0064162 A1 | 3/2021 | Yin et al. |
| 2021/0200353 A1* | 7/2021 | Liu ......................... G06F 3/0446 |
| 2022/0187665 A1* | 6/2022 | Xiao ..................... G06F 3/0412 |
| 2023/0141463 A1* | 5/2023 | Huang ................ G02F 1/13338 345/174 |

FOREIGN PATENT DOCUMENTS

| | | |
|---|---|---|
| CN | 107065365 A | 8/2017 |
| CN | 107358930 A | 11/2017 |
| CN | 110874156 A | 3/2020 |
| CN | 106406623 B | 4/2020 |
| CN | 111045549 A | 4/2020 |
| CN | 112987424 A | 6/2021 |
| CN | 113835259 A | 12/2021 |
| JP | 2017507436 A | 3/2017 |
| JP | 2019525341 A | 9/2019 |
| KR | 101809576 B1 | 12/2017 |
| WO | 2014169520 A1 | 10/2014 |
| WO | 2016090656 A1 | 6/2016 |
| WO | 2017107291 A1 | 6/2019 |

* cited by examiner

DISPLAY SUBSTRATE AND DISPLAY DEVICE

TECHNICAL FIELD

Embodiments of the present disclosure relate to a display substrate and a display device.

BACKGROUND

In general, a display device has an In-cell or On-cell touch configuration to achieve a touch function. The In-cell touch configuration is integrated within the display substrate of the display device, which is beneficial to facilitate a narrow bezel and thin design of the display device. In combination with the TDDI (Touch and Display Driver Integration) scheme, i.e., a scheme of integrating touch and display driving, the narrow bezel and thin design of the display device can be further achieved.

SUMMARY

At least an embodiment of the present disclosure provides a display substrate having a display area and a peripheral area surrounding the display area, and having a touch function. The display substrate comprises a first common voltage line, a second common voltage line, and an integrated circuit; the first common voltage line is provided in the peripheral area and at least partially surrounds the display area; the second common voltage line is provided in the peripheral area, located on a side of the first common voltage line away from the display area, and at least partially surrounds the display area; the integrated circuit is provided in the peripheral area, located on the a first side of the display area, and configured to provide first signals identical to display signals to the first common voltage line and the second common voltage line during the display stage, and provide second signals identical to touch signals to the first common voltage line and the second common voltage line during the touch stage, and the first signals are different from the second signals.

For example, in the display substrate provided by at least an embodiment of the present disclosure, the display area comprises a plurality of sub-pixels, and the display substrate further comprises a touch structure and a plurality of third common voltage lines; wherein the touch structure is provided in at least one of the display area and the peripheral area, comprises a plurality of touch electrodes, and is configured to achieve the touch function; the plurality of third common voltage lines are provided in the peripheral area and the display area, and configured to electrically connect the plurality of sub-pixels and the plurality of touch electrodes; the integrated circuit is further configured to provide the display signals to the plurality of sub-pixels by the plurality of third common voltage lines during the display stage, and provide the touch signals to the plurality of touch electrodes by the plurality of third common voltage lines during the touch stage.

For example, in the display substrate provided by at least an embodiment of the present disclosure, each display signal is a direct-current (DC) voltage, and each touch signal is an impulse voltage.

For example, in the display substrate provided by at least an embodiment of the present disclosure, the DC voltage comprises a first DC voltage signal, and the impulse voltage has a maximum potential and a minimum potential, and the first DC voltage signal has a potential higher than the maximum potential.

For example, in the display substrate provided by at least an embodiment of the present disclosure, the DC voltage further comprises a second DC voltage signal, the first DC voltage signal has a potential higher than a potential of the second DC voltage signal, and the second DC voltage signal has a potential lower than the minimum potential.

For example, in the display substrate provided by at least an embodiment of the present disclosure, each of the plurality of third common voltage lines is connected to one touch electrode of the plurality of touch electrodes and N sub-pixels of the plurality of sub-pixels, where N is a positive integral greater than 1.

For example, in the display substrate provided by at least an embodiment of the present disclosure, the first common voltage line comprises a first connection end and a second connection end, the second common voltage line comprises a third connection end and a fourth connection end, the first connection end is electrically connected to the third connection end, and the second connection end is electrically connected to the fourth connection end, so that the first common voltage line is electrically connected to the second common voltage line.

For example, in the display substrate provided by at least an embodiment of the present disclosure, the integrated circuit comprises a first binding end and a second binding end provided with a spacing and a third binding end and a fourth binding end provided with a spacing, the first binding end is electrically connected to the third binding end, the second binding end is electrically connected to the fourth binding end; the first connection end is electrically connected to the first binding end, the third binding end is electrically connected to the third connection end, the second connection end is electrically connected to the second binding end, the fourth binding end is electrically connected to the fourth connection end, so that the first common voltage line is electrically connected to the second common voltage line.

For example, the display substrate provided by at least an embodiment of the present disclosure further comprises: a circuit board provided in the peripheral area and at least partially provided on a side of the integrated circuit away from the display area, the third connection end and the fourth connection end are electrically connected to the third binding end and the fourth binding end via the circuit board, respectively.

For example, in the display substrate provided by at least an embodiment of the present disclosure, the integrated circuit comprises a first sub-integrated circuit and a second sub-integrated circuit provided in parallel, the first binding end and the third binding end are provided at an end of the first sub-integrated circuit away from the second sub-integrated circuit, and the second binding end and the fourth binding end are provided at an end of the second sub-integrated circuit away from the first sub-integrated circuit.

For example, in the display substrate provided by at least an embodiment of the present disclosure, the first sub-integrated circuit further comprises a fifth binding end provided at an end of the first sub-integrated circuit near the second sub-integrated circuit, the second sub-integrated circuit further comprises a sixth binding end provided at an end of the second sub-integrated circuit near the first sub-integrated circuit. The fifth binding end and the sixth binding end are inputted with the display signals during the display stage, and are inputted with the touch signals during the touch stage, and the fifth binding end and the sixth binding end are floatingly provided.

For example, in the display substrate provided by at least an embodiment of the present disclosure, the first sub-integrated circuit further comprises a plurality of seventh binding ends provided between the first binding end and the fifth binding end, the second sub-integrated circuit further comprises a plurality of eighth binding ends provided between the second binding end and the sixth binding end, the plurality of third common voltage lines are electrically connected to the plurality of seventh binding ends and the plurality of eighth binding ends, respectively.

For example, in the display substrate provided by at least an embodiment of the present disclosure, the first common voltage line and the second common voltage line surround the display area at least on the second side, the third side and the fourth side of the display substrate, and is connected to the integrated circuit on the first side of the display area, the first side is opposite to the second side, and the third side is opposite to the fourth side.

For example, in the display substrate provided by at least an embodiment of the present disclosure, the first common voltage line and the second common voltage line are in grid shapes, respectively.

For example, the display substrate provided by at least an embodiment of the present disclosure further comprises a base substrate, each of the plurality of sub-pixels comprises a pixel driving circuit provided on the base substrate, the pixel driving circuit comprises a thin film transistor comprising a gate electrode, a source electrode, and a drain electrode, and the first common voltage line and the second common voltage line are provided in a same layer as the gate electrode.

For example, in the display substrate provided by at least an embodiment of the present disclosure, the display substrate further comprises a plurality of gate leads provided on the base substrate, the plurality of gate leads are electrically connected with the gate electrodes of the thin film transistors of the plurality of sub-pixels, and the gate leads are provided in a same layer as the gate electrodes or the source and drain electrodes, respectively.

For example, in the display substrate provided by at least an embodiment of the present disclosure, the plurality of gate leads extend to the peripheral area, and at least a portion of each gate lead in the peripheral area is located between the first common voltage line and the second common voltage line.

For example, in the display substrate provided by at least an embodiment of the present disclosure, the plurality of touch electrodes are located on a side of the pixel driving circuit away from the base substrate.

For example, in the display substrate provided by at least an embodiment of the present disclosure, the plurality of touch electrodes are provided in a same layer as the plurality of third common voltage lines.

For example, in the display substrate provided by at least an embodiment of the present disclosure, each thin film transistor further comprises an active layer which does not overlap with the plurality of touch electrodes or the plurality of third common voltage lines in a direction perpendicular to the base substrate.

For example, the display substrate provided by at least an embodiment of the present disclosure further comprises a ground line provided in the peripheral area, the ground line being located on a side of the second common voltage line away from the display area, and at least partially surrounding the display area.

For example, in the display substrate provided by at least an embodiment of the present disclosure, the ground line is provided in a same layer as the gate electrode.

For example, the display substrate provided by at least an embodiment of the present disclosure further comprises: a test line provided in the peripheral area, the test line is located on a side of the ground line away from the display area and located on the second side of the display area opposite to the first side.

For example, in the display substrate provided by at least an embodiment of the present disclosure, the test line is provided in a same layer as the gate electrode.

At least an embodiment of the present disclosure also provides a display device, comprising the display substrate provided by the embodiments of the present disclosure, an opposite substrate, and a liquid crystal layer; the opposite substrate is opposite to the display substrate, and the liquid crystal layer is located between the display substrate and the opposite substrate.

BRIEF DESCRIPTION OF THE DRAWINGS

In order to clearly illustrate the technical solution of the embodiments of the disclosure, the drawings of the embodiments will be briefly described in the following; it is apparent that the described drawings are only related to some embodiments of the disclosure and thus are not limitative of the disclosure.

DETAILED DESCRIPTION

In order to make objects, technical schemes and advantages of the embodiments of the present disclosure clearer, the technical schemes of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect/connecting", "connected", etc., are not intended to limit only to a physical connection or mechanical connection, and they may also include an electrical connection, directly or indirectly. "On," "under," "right," "left" and the like are only used to indicate relative position relationship, and when the absolute position of the object which is described is changed, the relative position relationship may be changed accordingly.

Figure 1:
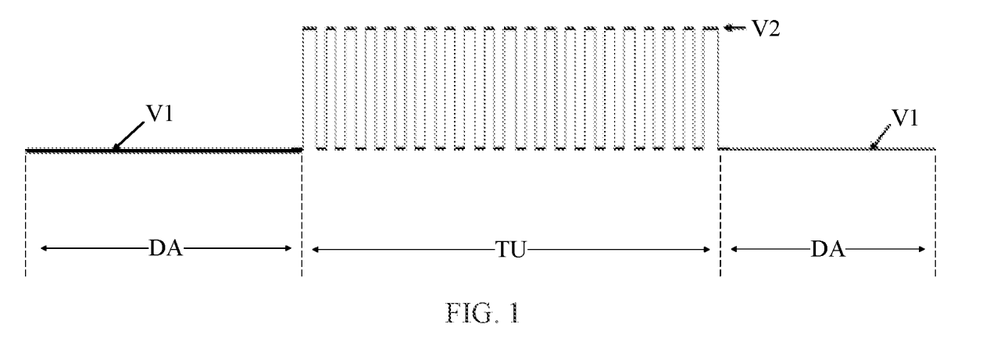
FIG. 1 is a signal waveform graph of a display substrate during a display stage and a touch stage provided by at least an embodiment of the present disclosure.

In TDDI schemes, the display signals and touch signals can be provided in a time-sharing way by the same signal using the same Integrated Circuit (IC). For example, in some embodiments, as shown in FIG. 1, during the display stage DA, the integrated circuit provides a common voltage signal V1 to the plurality of sub-pixels in the display area by the signal line, and the common voltage signal V1 can be a DC voltage signal; and during the touch stage TU, the integrated circuit provides an impulse voltage signal V2 with high-frequency inversion to the touch structure by the signal line to recognize a change in capacitance caused by the touch of an operation body, e.g., a finger. However, the high-frequency impulse voltage signal V2 of the touch signal often causes coupling disturbance to other signal lines on the display substrate, resulting in the inaccurate signal transmission of the signal lines.

For example, in the GOA (Gate on Array) products, a GOA signal and a touch signal can be inversed together at high frequency to reduce the coupling disturbance. However, for the Gate IC+TDDI products in which the gate scanning drive circuit is integrated into the IC, such coupling disturbance is inevitable.

At least an embodiment of the present disclosure provides a display substrate and a display device. The display substrate has a display area and a peripheral area surrounding the display area, and has a touch function. The display substrate comprises a first common voltage line, a second common voltage line, and an integrated circuit; the first common voltage line is disposed in the peripheral area and at least partially surrounds the display area; the second common voltage line is disposed in the peripheral area, the second common voltage line is located on a side of the first common voltage line away from the display area and at least partially surrounds the display area; and the integrated circuit is disposed in the peripheral area, the integrated circuit is located on a first side of the display area and configured to provide first signals identical to display signals to the first common voltage line and the second common voltage line during the display stage, and provide second signals identical to touch signals to the first common voltage line and the second common voltage line during the touch stage, and the first signals are different from the second signals.

In the display substrate provided by the embodiment of the present disclosure, the integrated circuit provides the same electrical signals in a time-sharing way to both the first common voltage line and the second common voltage line located in the peripheral area during the display stage and the touch stage, so that the signals transmitted by the first common voltage line and the second common voltage line can be consistent, and no coupling disturbance of signals will occur, thereby avoiding the inaccuracy of the signal lines transmitting signals, and improving the display quality and the touch effect of the display substrate.

Hereinafter, the display substrate and the display device provided by the embodiments of the present disclosure are described in detail by reference to several examples.

Figure 2:
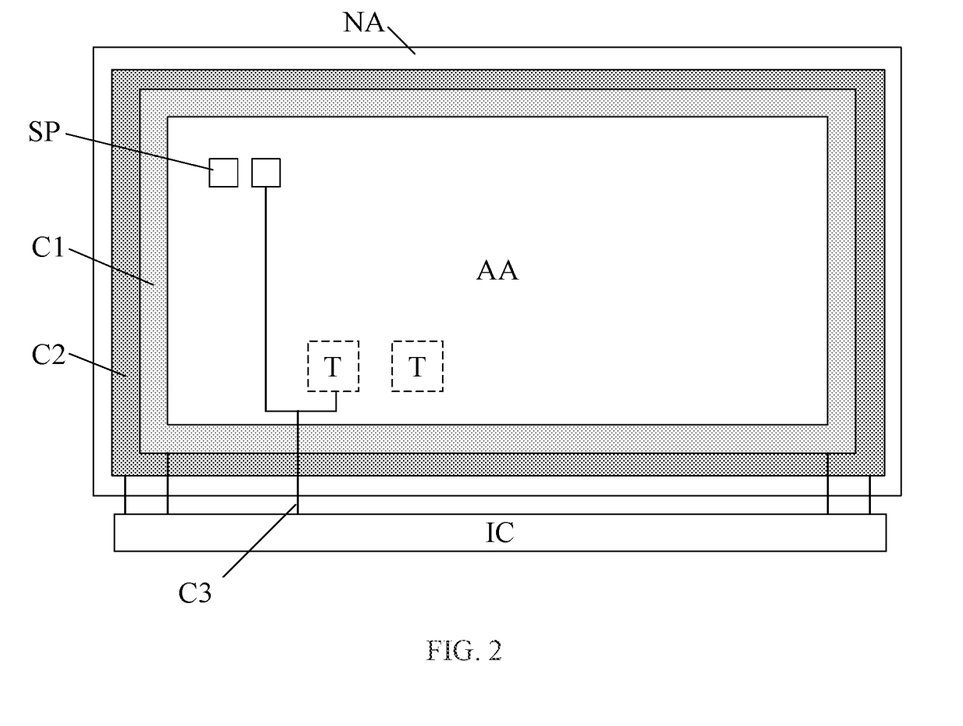
FIG. 2 is a schematic plan view of a display substrate provided by at least an embodiment of the present disclosure.

At least an embodiment of the present disclosure provides a display substrate. FIG. 2 shows a schematic plan view of the display substrate. As shown in FIG. 2, the display substrate has a display area AA and a peripheral area NA surrounding the display area AA, and has a touch function.

The display substrate comprises a first common voltage line C1, a second common voltage line C2, and an integrated circuit IC; the first common voltage line C1 is disposed in the peripheral area NA and at least partially surrounds the display area AA; the second common voltage line C2 is disposed in the peripheral area NA, the second common voltage line C2 is located on a side of the first common voltage line C1 away from the display area AA and at least partially surrounds the display area AA; the integrated circuit IC is disposed in the peripheral area NA, the integrated circuit IC is located on a first side of the display area AA (the lower side of the display area AA as shown in FIG. 2) and configured to provide first signals identical to display signals to the first common voltage line C1 and the second common voltage line C2 during the display stage, and provide second signals identical to the touch signals to the first common voltage line C1 and the second common voltage line C2 during the touch stage, and the first signals are different from the second signals. For example, in some embodiments, the first signal is a common voltage signal, e.g., a DC voltage signal; and the second signal is an impulse voltage signal.

For example, in some embodiments, as shown in 2, the display area AA comprises a plurality of sub-pixels SP; and the display substrate further comprises a touch structure (described in detail below), and a plurality of the third common voltage line C3 (one third common voltage line C3 is shown in FIG. 2 as an example). The touch structure is disposed in at least one of the display area and the peripheral area, the touch structure comprises a plurality of touch electrodes T and is configured to achieve the touch function. For example, the plurality of touch electrodes T can be disposed in the display area AA, in the peripheral area NA, or in both the display area AA and the peripheral area NA to achieve the touch function in the corresponding positions.

For example, the plurality of third common voltage lines C3 are disposed in the peripheral area NA and the display area AA, i.e. the plurality of third common voltage lines C3 extend in the peripheral area NA and the display area AA, and configured to electrically connect the plurality of sub-pixels SP and the plurality of touch electrodes T. The integrated circuit IC is further configured to provide display signals (e.g., common voltage signals, such as DC voltage signals) to the plurality of sub-pixels SP by the plurality of third common voltage lines C3 during the display stage, and provide touch signals, such as impulse voltage signals, to the plurality of touch electrodes T by the plurality of third common voltage lines C3 during the touch stage. For example, the waveforms of the display signals (the first signals) and the touch signals (the second signals) can refer to FIG. 1.

For example, in some embodiments, the touch structure can be a self-capacitance-type touch structure or a mutual-capacitance-type touch structure, etc. The embodiments of the present disclosure are illustrated by using a mutual-capacitance-type touch structure as an example. The self-capacitance-type touch structure typically comprises a plurality of touch electrodes, such as a plurality of block touch electrodes, i.e., the touch electrodes T. When an operation body, such as a finger, touches the screen, a coupling capacitance will be formed between the finger and the touch electrode at the touch position due to the human body electric field, resulting in the change in the original capacitance of the touch electrode. By detecting the position of the changed touch electrode, the touch position can be determined.

For example, in the above embodiments, the plurality of third common voltage lines C3 are simultaneously used as the common voltage line for the plurality of sub-pixels SP and the touch signal lines for the plurality of touch electrodes T. The integrated circuit provide the display signals or the touch signals in a time-sharing way to the plurality of third common voltage lines C3. As a result, the number of signal lines on the display substrate can be reduced so that the structure and the wiring arrangement of the display substrate are simplified so as to facilitate the narrow-bezel and thinning design of the display substrate.

For example, in some embodiments, one third common voltage line C3 is connected to one touch electrode T to provide the touch signal to the one touch electrode T; and one third common voltage line C3 is connected to N sub-pixels (wherein N is a positive integer greater than 1) to provide the display signals to the N sub-pixels. For example, based on the size of the touch electrode T, one touch electrode T can correspond to 2,000 to 8,000 sub-pixels, such as 3,000, 4,000, 5,000, 6,000 or 7,000 sub-pixels, or the like, that is, N=2000 to 8000. One third common voltage line C3 can be connected to 2,000 to 8,000 sub-pixels to provide the display signals, such as common voltage signals, to the 2,000 to 8,000 sub-pixels.

Figure 3:
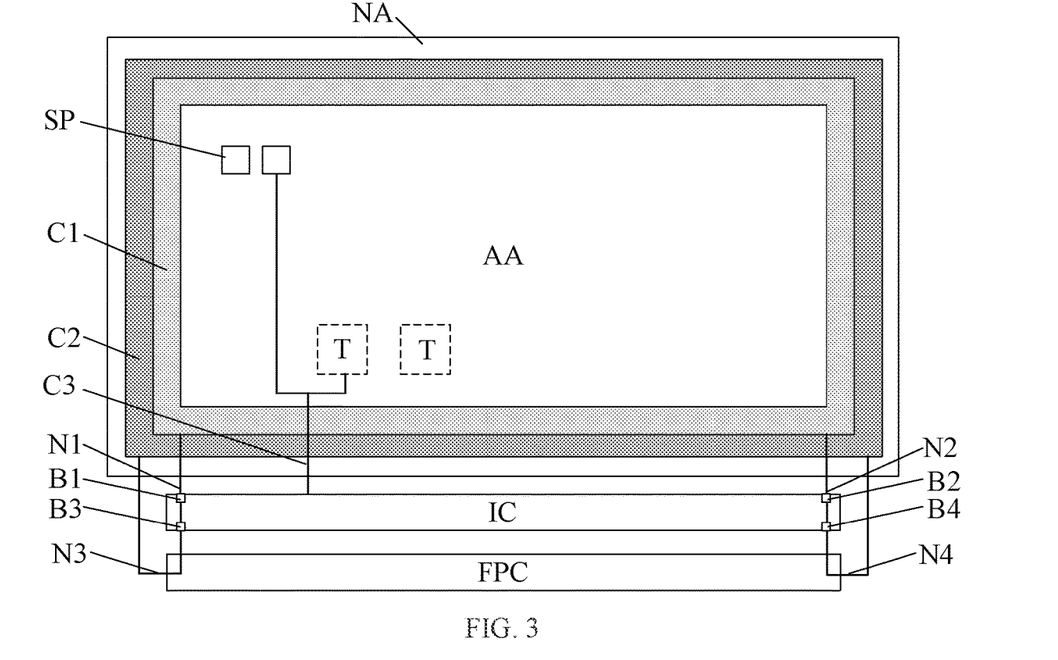
FIG. 3 is a schematic plan view of another display substrate provided by at least an embodiment of the present disclosure.

For example, FIG. 3 shows a schematic plan view of another display substrate provided by at least an embodiment of the present disclosure. As shown in 3, in some embodiments, the first common voltage line C1 comprises a first connection end N1 and a second connection end N2, and the second common voltage line C2 comprises a third connection end N3 and a fourth connection end N4. The first connection end N1 is electrically connected to the third connection end N3, and the second connection end N2 is electrically connected to the fourth connection end N4, so that the first common voltage line C1 is electrically connected to the second common voltage line C2. In this way, the signal transmission of the first common voltage line C1 and the second common voltage line C2 can be more synchronous.

For example, in some embodiments, as shown in FIG. 3, the integrated circuit IC comprises a first binding end B1 and a second binding end B2 disposed with a spacing and a third binding end B3 and a fourth binding end B3 disposed with a spacing. The first binding end B1 is electrically connected to the third binding end B3, and the second binding end B2 is electrically connected to the fourth binding end B4. The first connection end N1 is electrically to the first binding end B1, the third binding end B3 is electrically to the third connection end N3, the second connection end N2 is electrically to the second binding end B2, and the fourth binding end B4 is electrically connected to the fourth connection end N4, so that the first common voltage line C1 is electrically connected to the second common voltage line C2 via the integrated circuit IC.

For example, in some embodiments, as shown in FIG. 3, the display substrate further comprises a circuit board F. For example, the circuit board F comprises at least one of Flexible Printed Circuit (FPC) and Printed Circuit Board (PCB) (with the Flexible Printed Circuit shown in the accompanying drawings, as examples). The circuit board F is disposed in the peripheral area NA and at least partially disposed on a side of the integrated circuit IC away from the display area AA. For example, the third connection end N3 and the fourth connection end N4 are electrically connected to the third binding end B3 and the fourth binding end B4 via the circuit board F, respectively. For example, the third connection end N3 and the fourth connection end N4 are bound to the circuit board F, and then bound to the third binding end B3 and the fourth binding end B4 at the other end of the circuit board F via the lines on the circuit board F.

In this way, in the embodiments, the first common voltage line C1 is directly connected to the first binding end B1 of the integrated circuit IC, and then further connected to the second common voltage line C2 via the circuit board F (e.g., via the Flexible Printed Circuit and the Printed Circuit Board sequentially). In this way, the first common voltage line C1 and the second common voltage line C2 are connected at distal ends, which is more beneficial to shielding the Electro-Static discharge (ESD).

For example, in some embodiments, the first binding end B1, the second binding end B2, the third binding end B3 and the fourth binding end B3 can each comprise one, two, or more binding pins to enable the first common voltage line C1 and the second common voltage line C2 to be effectively bounded to the integrated circuit IC.

Figure 4:
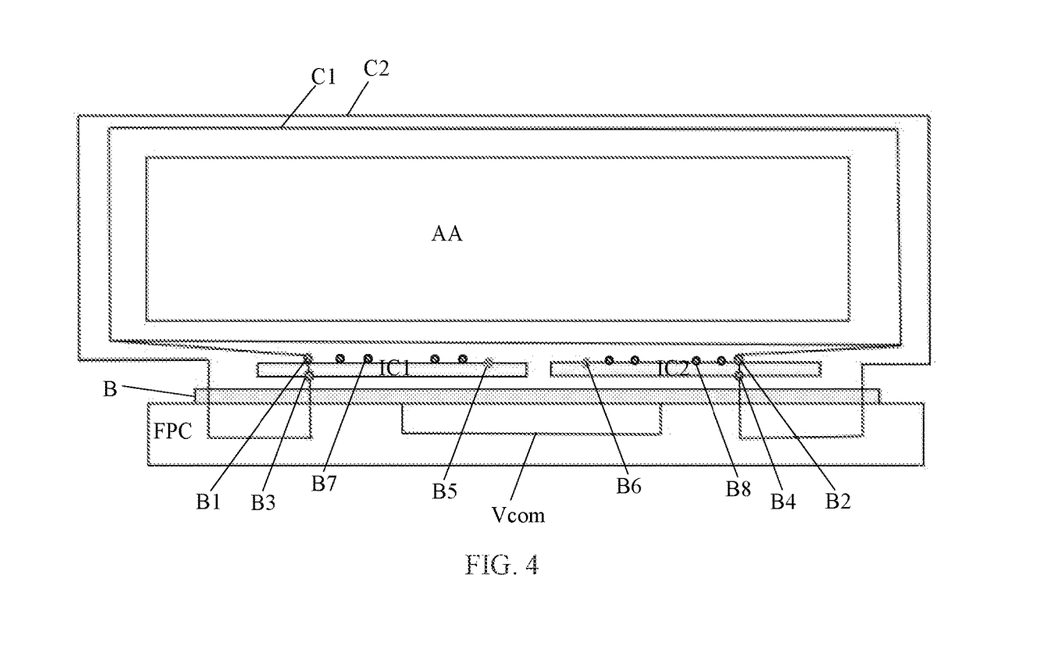
FIG. 4 is a schematic plan view of still another display substrate provided by at least an embodiment of the present disclosure.

For example, in some embodiments, FIG. 4 shows a schematic plan view of still another display substrate provided by at least an embodiment of the present disclosure. As shown in FIG. 4, the integrated circuit IC can comprise a first sub-integrated circuit IC1 and a second sub-integrated circuit IC2 disposed in parallel on the first side of the display area AA. For example, the first sub-integrated circuit IC1 is the main IC, and the second sub-integrated circuit IC2 is the secondary IC. The first sub-integrated circuit IC1 and the second sub-integrated circuit IC2 can be configured to provide drive signals to the sub-pixels SP or the touch electrodes T in different areas.

For example, as shown in FIG. 4, the first binding end B1 and the third binding end B3 are disposed on a side of the first sub-integrated circuit IC1 away from the second sub-integrated circuit IC2, i.e., the left end in the figure; and the second binding end B2 and the fourth binding end B4 are disposed at an end of the second sub-integrated circuit IC2 away from the first sub-integrated circuit IC1, i.e., the right end in the figure so that the first binding end B1 and the second binding end B2 are separated by a certain distance.

For example, in some embodiments, as shown in FIG. 4, the first sub-integrated circuit IC1 further comprises a fifth binding end B5 disposed at an end of the first sub-integrated circuit IC1 near the second sub-integrated circuit IC2 (the right end in the figure), and the second sub-integrated circuit IC2 further comprises a sixth binding end B6 disposed at an end of the second sub-integrated circuit IC2 near the first sub-integrated circuit IC1 (the left end in the figure). The fifth binding end B5 and the sixth binding end B6 are inputted with the display signals during the display stage and the touch signals during the touch stage. For example, the fifth binding end B5 and the sixth binding end B6 are floatingly disposed, i.e., the fifth binding end B5 and the sixth binding end B6 are not connected to the signal lines.

For example, in the above embodiments, the right end of the first sub-integrated circuit IC1 and the right end of the second sub-integrated circuit IC2 are both the proximal ends within the ICs, while the left end of the first sub-integrated circuit IC1 and the left end of the second sub-integrated circuit IC2 are both the distal ends within the ICs. Considering that the signal transmissions at the proximal and distal ends within the ICs are not synchronous, e.g., a signal is first provided to the proximal ends within the ICs, and then to the distal ends within the ICs, a floating design is used for the fifth binding end B5 and the sixth binding end B6 which are close to each other, which can prevent the asynchronous signals from interfering with each other caused by the asynchrony of the transmitted touch signals, thereby contributing to the improvement of the touch performance.

For example, the fifth binding end B5 and the sixth binding end B6 can also comprise one, two, or more binding pins, respectively, so as to be consistent with the settings of the first binding end B1 and the second binding end B2.

For example, in some embodiments, as shown in FIG. 4, the first sub-integrated circuit IC1 further comprises a plurality of seventh binding ends B7 disposed between the first binding end B1 and the fifth binding end B5, the second sub-integrated circuit IC2 further comprises a plurality of eighth binding ends B8 disposed between the second binding end B2 and the sixth binding end B6, and the plurality of third common voltage lines C3 are electrically connected to the plurality of seventh binding ends B7 and the plurality of eighth binding ends B8.

For example, the seventh binding ends B7 and the eighth binding ends B8 can comprise one, two, or more binding pins, respectively, which is not specially limited by the embodiments of the present disclosure.

For example, in the embodiments of the present disclosure, the plurality of seventh binding ends B7 and the plurality of eighth binding ends B8 are configured to provide the display signals (e.g., common voltage signals, e.g., DC voltage signals) to the plurality of sub-pixels SP by the plurality of third common voltage lines C3 during the display stage, and provide the touch signals (e.g., impulse voltage signals) to the plurality of touch electrodes T by the plurality of third common voltage lines C3 during the touch stage. That is, the plurality of seventh binding ends B7 and the plurality of eighth binding ends B8 are those for transmitting effective drive signals and used for achieve the display function and the touch function.

For example, in the embodiments of the present disclosure, though the first common voltage line C1 and the second common voltage line C2 are applied with and transmit the display signals during the display stage and the touch signals during the touch stage, such signals are not used to control the display operation and the touch operation, they only play an role of preventing signal cross-talking or the like by transmitting signals consistent with those of the third common voltage line C3 in the peripheral area surrounding the display area.

For example, the first common voltage line C1 is disposed on the inner periphery of the display substrate with respect to the second common voltage line C2 so that the signals of the display area AA can be shielded on a side near the display area AA; and the second common voltage line C2 is disposed on the outer periphery of the display substrate with respect to the first common voltage line C1 so as to prevent external static electricity on the outer periphery of the display substrate and to play a role of electrostatic shielding.

For example, in some embodiments, the first binding end B1, the second binding end B2, the fifth binding end B5, sixth binding end B6, the plurality of seventh binding ends B7 and the plurality of eighth binding ends B8 have substantially same structure and transmit same signals so that the consistency of the signal transmission can be ensured. For example, in some embodiments, the first binding end B1, the second binding end B2, the fifth binding end B5, and the sixth binding end B6 can also be called Dummy ends because they are not used to connect the sub-pixels and the touch electrodes.

For example, as shown in FIG. 4, the plurality of seventh binding ends B7 in the first sub-integrated circuit IC1 are located between the first binding end B1 and the fifth binding end B5, and the plurality of eighth binding ends B8 in the second sub-integrated circuit IC2 are located between the second binding end B2 and the sixth binding end B6. In this way, in each sub-integrated circuit, the binding ends for transmitting the effective drive signals is located between the Dummy ends, and therefore can further avoid the binding ends for transmitting the effective drive signals and the corresponding signal lines from being interfered.

For example, in some embodiments, as shown in FIG. 4, the Flexible Printed Circuit FPC has a binding end B. The third connection end N3 of the second common voltage line C2 is connected to the circuit in the Flexible Printed Circuit via at least one pin of the binding end, and connected to the third binding end B3 via at least another pin of the binding end. The connection of the fourth connection end N4 is similar to the connection of the third connection end N3.

For example, in some embodiments, as shown in FIG. 4, the binding end of the Flexible Printed Circuit FPC further comprises a plurality of DC voltage output pins configured to be inputted with DC voltage signals. At that time, the plurality of DC voltage output pins can be short-circuited via a signal line Vcom so that it is not used to provide an effective drive signal.

Figure 11:
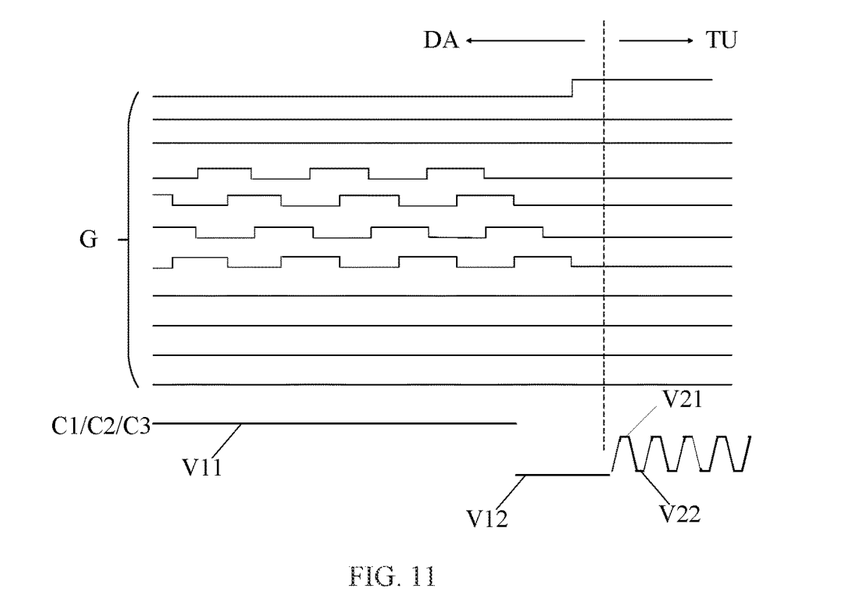
FIG. 11 shows signal waveform diagrams of the first common voltage signal line, the second common voltage signal line, and the third common voltage signal line in the display substrate provided by an embodiment of the present disclosure.

For example, FIG. 11 shows signal waveform diagrams of the first common voltage line, the second common voltage line, and the third common voltage line of the display substrate provided by at least an embodiment of the present disclosure. As shown in FIG. 11, in some embodiments, the first common voltage line C1, the second common voltage line C2, and the third common voltage line C3 have a waveform of a thick solid line as shown at the bottom of FIG. 11. During the display stage DA, the first common voltage line C1, the second common voltage line C2, and the third common voltage line C3 are applied with a first DC voltage signal V11 or a second DC voltage signal V12 (i.e., the first signal), and the first DC voltage signal V11 has a potential higher than that of the second DC voltage signal V12; and during the touch stage TU, the first common voltage line C1, the second common voltage line C2, and the third common voltage line C3 are applied with an impulse signal (i.e., the second signal), e.g., an impulse voltage, which has a maximum potential V21 and a minimum potential V22. For example, the first DC voltage signal V11 has a potential higher than the maximum potential V21 of the impulse voltage, and the second DC voltage signal V12 has a potential lower than the minimum potential V22 of the impulse voltage, meeting the requirements of the signal in different stages.

For example, FIG. 11 also shows a partial waveform G of the gate scanning drive circuit which can, e.g., control the supply of a scanning voltage to the gate electrode of the thin film transistor in the pixel driving circuit of a plurality of sub-pixels. Relevant technologies for specific waveforms can be referred to, which are not repeated herein.

For example, in some embodiments, as shown in FIG. 4, the first common voltage line C1 and the second common voltage line C2 surround the display area AA at least at the second side (e.g., the upper side of the display substrate), the third side (e.g., the left side of the display substrate), and the fourth side (e.g., the right side of the display substrate) of the display area AA, and the first common voltage line C1 and the second common voltage line C2 are electrically connected to the integrated circuit IC at the first side of the display area AA, and the first side is opposite to the second side, and the third side is opposite to the fourth side.

For example, in some embodiments, as shown in FIG. 4, the first common voltage line C1 can also surround the display area AA on the first side of the display area AA to play a role of preventing signal interference around the display area AA. For example, in some embodiments, as shown in FIG. 3, the second common voltage line C2 also surround the display area AA on the first side of the display area AA to play a role of fully preventing signal interference around the display area AA.

Figure 5:
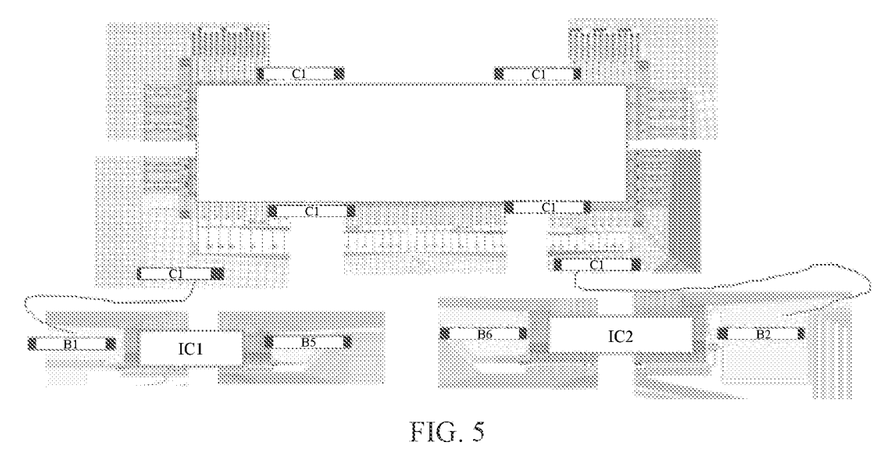
FIG. 5 is a diagram showing a partial circuit structure of a display substrate provided by at least an embodiment of the present disclosure.
Figure 6:
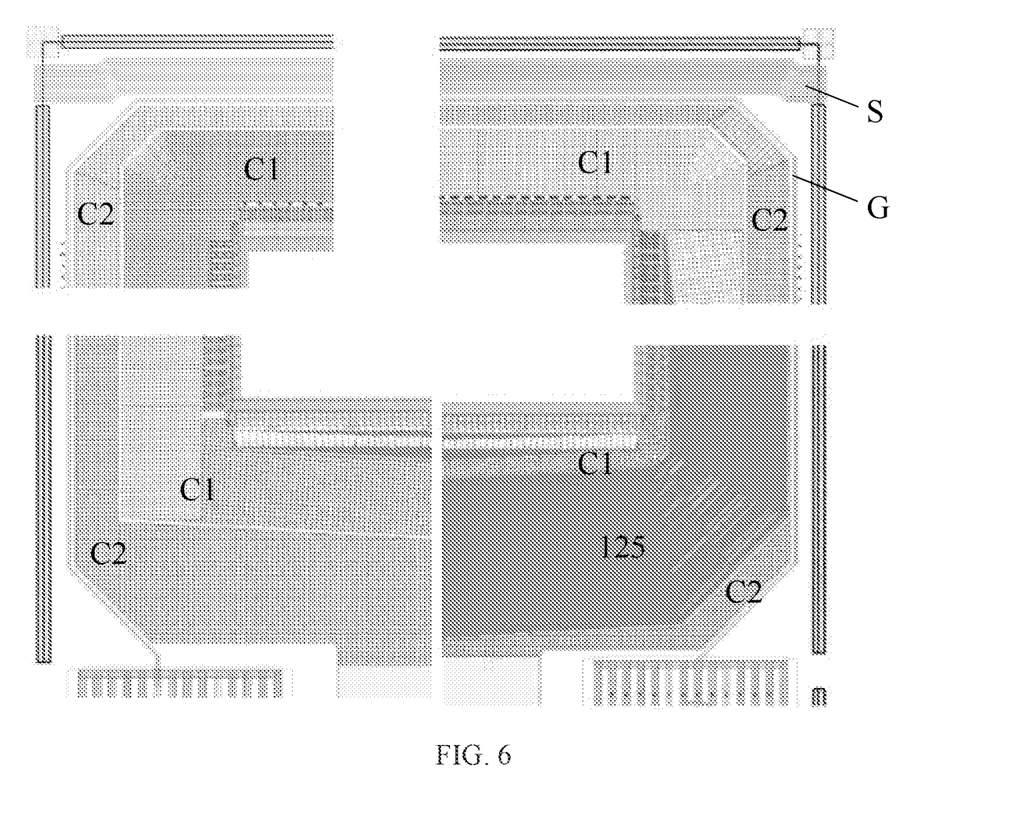
FIG. 6 is a diagram showing a partial circuit structure at the positions of four corners of a display substrate provided by at least an embodiment of the present disclosure.

For example, FIG. 5 shows a partial circuit arrangement structure of a display substrate provided by at least an embodiment of the present disclosure. For clarity, FIG. 5 only shows part structures of the first common voltage line C1, and the first sub-integrated circuit IC1 and the second sub-integrated circuit IC2, as an example. FIG. 6 shows a partial circuit arrangement structure of a display substrate at the positions of four corners provided by at least an embodiment of the present disclosure. As shown in FIG. 5 and FIG. 6, in some embodiments, the first common voltage lines C1 and the second common voltage lines C2 are each in a grid shape to reduce the voltage drop, and improving the consistency of signal transmission in the first common voltage line C1 and the second common voltage line C2.

Figure 7:
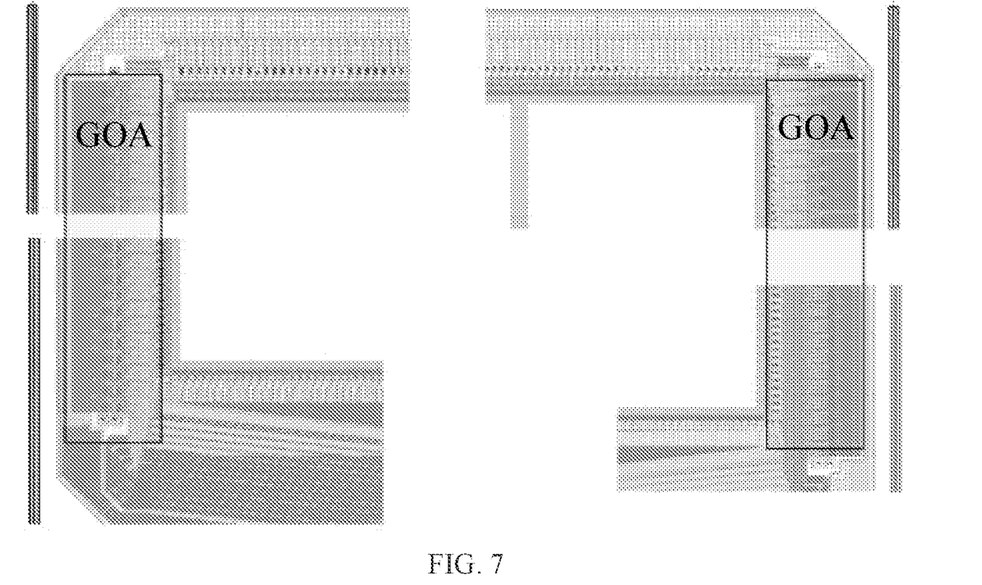
FIG. 7 is a diagram showing a partial circuit structure at the positions of four corners of another display substrate provided by at least an embodiment of the present disclosure.

For example, FIG. 7 shows a partial circuit structure of another display substrate at the positions of four corners provided by at least an embodiment of the present disclosure. As shown in FIG. 7, in some embodiments, the display substrate can further comprise a gate scanning drive circuit GOA disposed on the third side and the fourth side of the display area AA adjacent to the first side, i.e., forming a GOA (Gate on Array) display substrate. At that time, the transmitted signal in the gate scanning drive circuit can be configured during the touch stage to be consistent with the touch signal to reduce the coupling disturbance of signal. For example, in the embodiments in FIG. 7, the first common voltage line C1 and the second common voltage line C2 can be disposed on a side of the gate scanning drive circuit GOA away from the display area AA to play a role of prevent signal interference on the more outer periphery.

Figure 8:
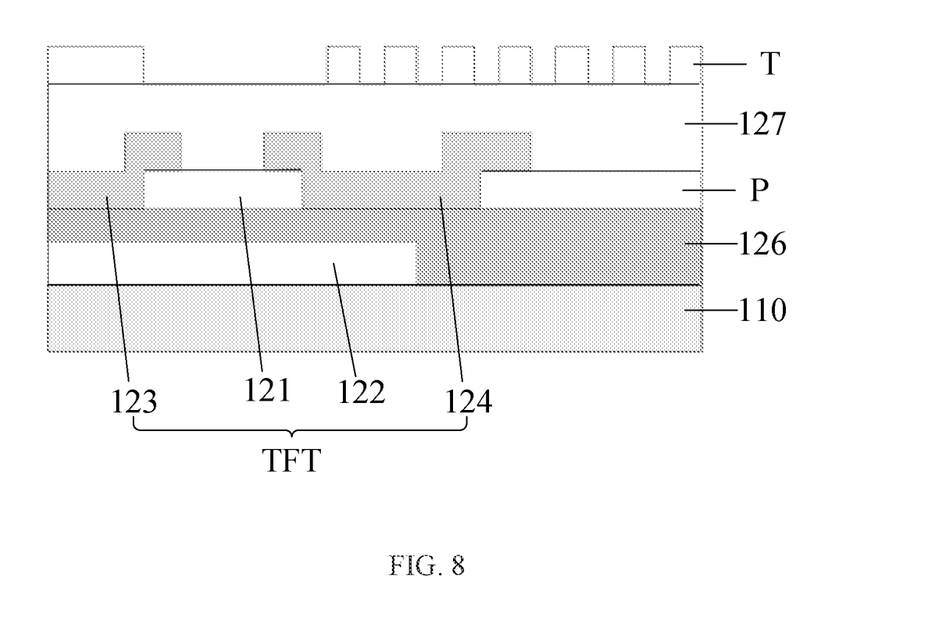
FIG. 8 is a schematically cross-sectional view of a display substrate provided by at least an embodiment of the present disclosure.

For example, FIG. 8 shows a schematically cross-sectional view of a display substrate provided by at least an embodiment of the present disclosure. In some embodiments, as shown in FIG. 8, the display substrate further comprises a base substrate 110, wherein each of the plurality of sub-pixels SP comprises a pixel driving circuit disposed on the base substrate 110, and the pixel driving circuit comprises a thin film transistor TFT comprising structures, such as an active layer 121, a gate electrode 122, a source electrode 123, a drain electrode 124.

For example, the thin film transistor TFT as shown in FIG. 8 is bottom-gate type, the gate electrode 122 is disposed on a side of the active layer 121 near the base substrate 110, and the gate electrode 122 is provided with a gate insulating layer 126. For example, in other embodiments, the thin film transistor TFT can also be top-gate type, the gate electrode 122 is disposed on a side of the active layer 121 away from the base substrate 110. The embodiments of the present disclosure do not limit the specific types of the thin film transistors TFT.

For example, in some embodiments, the first common voltage line C1 and the second common voltage line C2 can be disposed in a same layer as the gate electrode 122 so as to simplify the production process of the display substrate and contribute the thinning design of the display substrate.

It is to be noted that, in the embodiments of the present disclosure, two (or more) functional layers or structural layers are "disposed in the same layer" refer to that the two (or more) functional layers or structural layers are located in a same layer structure of the display substrate and formed from same material. That is, in the production process, the two (or more) functional layers or structural layers can be formed from a same material layer and can formed into a desired pattern and structure by a same patterning process.

For example, in some embodiments, as shown in FIG. 6, the display substrate further comprises a plurality of gate leads 125 disposed on the base substrate 110, the plurality of gate leads 125 are connected to the gate electrodes 122 of the thin film transistors TFT of the plurality of sub-pixels SP, respectively, and configured to provide gate scanning signals to the gate electrodes 122. For example, in some embodiments, the plurality of gate leads 125 are disposed in the same layer as the gate electrode 122 or the source and drain electrodes 123, 124.

For example, a part of the plurality of gate leads 125 are disposed in the same layer as the gate electrode 122. At that time, the gate leads 125 can be integrally connected to the gate electrode 122, and the other part of the plurality of gate leads 125 are disposed in the same layer as the source and drain electrodes 123, 124. At that time, the gate leads 125 can be connected to the gate electrodes 122 through via holes. Due to the large number of gate leads 125 on the display substrate, the plurality of gate leads 125 are arranged into two layers, i.e., a layer where the gate electrode 122 is located and a layer where the source and drain electrodes 123, 124 are located, which can simplify the arrangement difficulty of the gate leads 125 in each layer, and can avoid problems, such as signal cross-talking or short circuit, caused by too high arrangement density of the plurality of gate leads 125.

For example, in some embodiments, as shown in FIG. 6, the plurality of gate leads 125 extend to the peripheral area NA, and at least a portion of the plurality of gate leads 125 in the peripheral area NA are located between the first common voltage line C1 and the second common voltage line C2.

For example, as shown in FIG. 6, the plurality of gate leads 125 extend in the low right portion of the display substrate, e.g., to the integrated circuit IC, so that the integrated circuit IC can provide gate scanning signals to the plurality of gate leads 125. At that time, the first common voltage line C1 and the second common voltage line C2 on both sides of the plurality of gate leads 125 have a small distribution width to avoid the arrangement space for the plurality of gate leads 125.

For example, as shown in FIG. 8, the plurality of touch electrodes T are located on a side of the pixel driving circuit away from the base substrate 110. For example, the plurality of touch electrodes T are multiplexed as the common electrodes for the sub-pixels SP to provide the common voltages to the sub-pixels SP.

For example, as shown in FIG. 8, the display substrate further comprises a pixel electrode P electrically connected to the source and drain electrodes 124 of the thin film transistor TFT. For example, the pixel electrode is configured to be applied with a high level voltage, and the common electrode is configured to be applied with a low level voltage. When the display substrate is used in a liquid crystal display device, the liquid crystal can be driven by a voltage difference formed between the pixel electrode and the common electrode to undergo varying degrees of deflection, so as to achieve the display.

For example, in some embodiments, as shown in FIG. 8, the display substrate further comprises a passivation layer 127 disposed on the pixel electrode P to insulate the pixel electrode P from the common electrode.

For example, in some embodiments, the plurality of touch electrodes T are disposed in the same layer as the plurality of third common voltage lines C3 to simplify the production process of the display substrate and contribute to the thinning design of the display substrate.

For example, in a direction perpendicular to the base substrate 110, i.e., in the vertical direction in FIG. 8, the active layer 121 does not overlap with the plurality of touch electrodes T and the plurality of third common voltage lines C3, i.e., the orthographic projection of the active layer 121 on the base substrate 110 does not overlap with the orthographic projection of the plurality of touch electrodes T and the plurality of third common voltage lines C3 on the base substrate 110, thereby avoiding the signals transmitted in the plurality of touch electrodes T and the plurality of third common voltage lines C3 from affecting the conductivity of the active layer 121 and then affecting the normal operation of the thin film transistor.

For example, in some embodiments, the pixel electrode P, the plurality of touch electrodes T, and the plurality of third common voltage lines C3 can be made from transparent metal oxide materials, such as indium tin oxide (ITO), indium zinc oxide (IZO), to improve the transparency thereof.

For example, in some embodiments, as shown in FIG. 6, the display substrate can further comprise a ground line G, the ground line G is disposed in the peripheral area NA, the ground line G is located on a side of the second common voltage line C2 away from the display area AA and at least partially surrounds the display area AA. For example, the ground line G surrounds the display area AA on the second side, the third side, and the fourth side of the display substrate, and is connected to the integrated circuit IC on the first side of the display substrate. For example, the ground line G is configured to be applied with a grounding voltage, e.g., a zero voltage, to provide a signal shielding on the periphery of the display substrate.

For example, in some embodiments, the ground line G is disposed in the same layer as the gate electrode 122 to simplify the production process of the display substrate and contribute to the thinning design of the display substrate.

For example, in some embodiments, as shown in FIG. 6, the display substrate can further comprise a test line S, and the test line S is disposed in the peripheral area NA. The test line S is located on a side of the ground line G away from the display area AA and located on the second side of the display area AA opposite to the first side (the upper side as shown in the figure). For example, in some examples, the test line S is electrically connected to at least some of the plurality of sub-pixels SP to perform a lighting test for testing if at least some of the plurality of sub-pixels SP can display normally before delivery of the display substrate. However, after the delivery of the display substrate, the test line S would not take part in the display operation of the display substrate.

For example, in some embodiments, the test line S is disposed in the same layer as the gate electrode 122 to simplify the production process of the display substrate and contribute to the thinning design of the display substrate.

For example, in the embodiments of the present disclosure, the base substrate 110 can be a rigid substrate, such as glass substrate and quartz substrate, or a flexible substrate, such as polyimide (PI) substrate. The material of the active layer 121 comprises, but is not limited to silicon-based materials (amorphous silicon a-Si, polycrystalline silicon p-Si, etc.), metal oxide semi-conductors (IGZO, ZnO, AZO, IZTO, etc.) and organic materials (hexathiophene, polythiophene, etc.). During the production, some semi-conductor materials of the active layer 121 are allowed to be conductive to achieve good conductivity. For example, the gate electrode 122 and the source and drain electrodes 123, 124 can be made from metal materials, such as copper (Cu), aluminum (Al), molybdenum (Mo), magnesium (Mg), titanium (Ti), and tungsten (W) or alloy materials. For example, the gate electrode 122 and the source and drain electrodes 123, 124 can have a single-layer or multilayer structure, e.g., a multilayer metal structure, such as Ti/Al/Ti or Mo/Al/Mo.

For example, the gate insulating layer 126 and the passivation layer 127 can be inorganic insulating layers, e.g., made from inorganic insulating materials, such as silicon oxide (SiOx), silicon nitride (SiNy), or silicon oxynitride (SiOxNy).

For example, during the production of the display substrate, a gate electrode material layer can be first formed on the base substrate by using a process, such as sputtering or deposition, and then the gate electrode material layer is patterned by using a first mask to form the gate electrode 122. For example, the sequential patterning processes comprises the formation, exposure, development, and etching of a photoresist, which is not repeated in the embodiments of the present disclosure.

For example, after the preparation of the gate electrode 122, the gate insulating layer 126 is formed on the gate electrode 122 using a process, such as deposition, and then an active material layer is formed on the gate insulating layer 126 by using a process, such as sputtering or deposition, and then the active material layer is patterned by using a second mask to form the pattern of the active layer 121. For example, after the pattern of the active layer 121 is formed, a doping process can be performed on some area thereof to allow the joint position of the source and drain electrodes 123, 124 to be conductive.

For example, after the active layer 121 is formed, a pixel electrode material layer is formed on the active layer 121 and the gate insulating layer 126 by using a process such as sputtering or deposition, and then the pixel electrode material layer is patterned by using a third mask to form the pixel electrode P.

For example, after the pixel electrode P is formed, the source and drain electrode material layer is formed on the pixel electrode P by using a process, such as sputtering or deposition, and then the source and drain electrode material layer is patterned by using a fourth mask to form the source and drain electrodes 123, 124.

For example, after the source and drain electrodes 123, 124 are formed, a passivation material layer is formed on the source and drain electrodes 123, 124 by using a process, such as sputtering or deposition, and then the passivation material layer is patterned by using a fifth mask to form the passivation layer 127.

For example, after the passivation layer 127 is formed, a common electrode material layer is formed on the passivation layer 127 by using a process, such as sputtering or deposition, and then the common electrode material layer is patterned by using a sixth mask to form the common electrode layer, that is, the touch structure layer.

In this way, the production of the display substrate as shown in FIG. 8 can be produced by using six masks, and the production process is simplified and easy to done.

Figure 9:
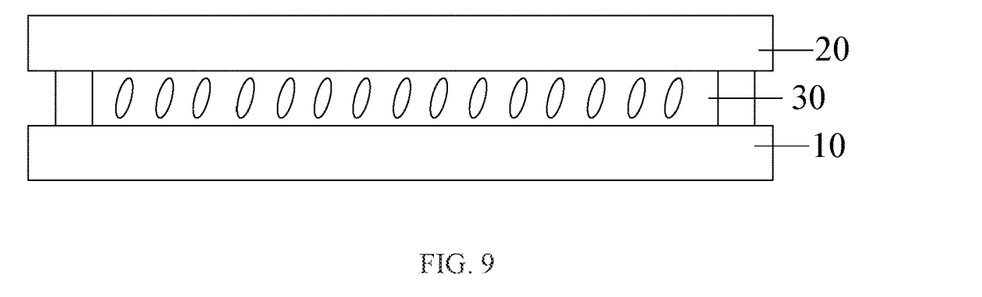
FIG. 9 is a schematically cross-sectional view of a display device provided by at least an embodiment of the present disclosure.

At least an embodiment of the present disclosure also provides a display device. FIG. 9 shows a schematically structural view of the display device. As shown in FIG. 9, the display device comprises the display substrate 10 provided by the embodiments of the present disclosure, an opposite substrate 20, and a liquid crystal layer 30. The opposite substrate 20 is opposite to the display substrate 10, and the liquid crystal layer 30 is located between the display substrate 10 and the opposite substrate 20. Therefore, the display device is achieved as a liquid crystal display device.

Figure 10:
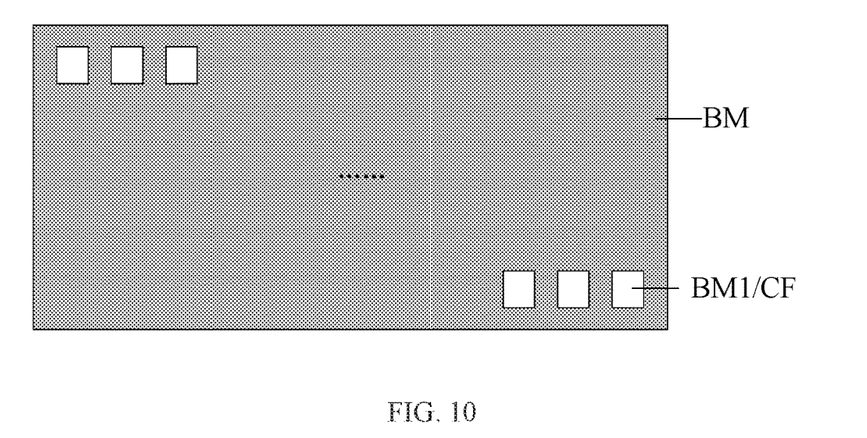
FIG. 10 is a schematic plan view of an opposite substrate of a display device provided by at least an embodiment of the present disclosure.

For example, in some embodiments, the opposite substrate 20 can be a color filter substrate. For example, FIG. 10 shows a schematic plan view of the color filter substrate. For example, as shown in FIG. 10, the color filter substrate comprises a black matrix layer BM and a plurality of color filter patterns CF. For example, the black matrix layer BM comprises a plurality of sub-pixel openings BM1 corresponding to the plurality of sub-pixels SP, the plurality of patterns CF are disposed in the plurality of sub-pixel openings BM1, respectively, so as to filter the light emitted from the plurality of sub-pixel openings BM1.

For example, the plurality of color filter patterns CF comprise red color filter patterns, green color filter patterns, and blue color filter patterns to achieve a full color display. Alternatively, in other embodiments, the plurality of color filter patterns CF can also have other colors, which are not specifically limited in the embodiments of the present disclosure.

For example, the opposite substrate 20 can further comprise other structures in addition to the afore-quoted structure by reference to relevant technologies for detail, which are not repeated in the embodiments of the present disclosure.

The following several points should be noted:
(1) The accompanying drawings involve only the structure(s) in connection with the embodiment(s) of the present disclosure, and other structure(s) can refer to common design(s).
(2) For clarity, in the accompanying drawings for illustrating the embodiment(s) of the present disclosure, the thickness of a layer or a region may be enlarged or decreased, that is, the drawings are not drawn in an actual scale. It is to be understood that, when a component, such as a layer, film, region, substrate, or the like, is referred to be "on" or "under" another component, the component may be directly on or under the another component, or a third component is interposed therebetween.
(3) Without conflicting with each other, embodiments of the present disclosure and the features in the embodiments may be mutually combined to obtain new embodiments.

The above descriptions are only exemplary embodiments of the present disclosure, but the scope of the present disclosure is not limited thereto, the scope of the present disclosure should be defined by the claims.

What is claimed is:

1. A display substrate having a display area and a peripheral area surrounding the display area, and having a touch function, the display substrate comprising:
   a first common voltage line provided in the peripheral area and at least partially surrounding the display area;
   a second common voltage line provided in the peripheral area, the second common voltage line being located on a side of the first common voltage line away from the display area and at least partially surrounding the display area; and
   an integrated circuit provided in the peripheral area, the integrated circuit being located at a first side of the display area and configured to provide first signals identical to display signals to the first common voltage line and the second common voltage line during a display stage, and provide second signals identical to touch signals to the first common voltage line and the second common voltage line,
   wherein the first signals are different from the second signals.

2. The display substrate according to claim 1, wherein the display area comprises a plurality of sub-pixels, and the display substrate further comprises:
   a touch structure provided in at least one of the display area and the peripheral area, the touch structure comprising a plurality of touch electrodes and being configured to achieve the touch function; and
   a plurality of third common voltage lines provided in the peripheral area and the display area, and configured to electrically connect the plurality of sub-pixels to the plurality of touch electrodes;
   the integrated circuit is further configured to provide the display signals to the plurality of sub-pixels by the plurality of third common voltage lines during the display stage, and provide the touch signals to the plurality of touch electrodes by the plurality of third common voltage lines during the touch stage.

3. The display substrate according to claim 2, wherein each of the plurality of third common voltage lines is connected to one touch electrode of the plurality of touch electrodes and N sub-pixels of the plurality of sub-pixels, where N is a positive integer greater than 1.

4. The display substrate according to claim 2, further comprising a base substrate, wherein each of the plurality of sub-pixels comprises a pixel driving circuit provided on the base substrate, and the pixel driving circuit comprises a thin film transistor comprising a gate electrode, a source electrode, and a drain electrode,
   wherein the first common voltage line and the second common voltage line and the gate electrode are provided in a same layer.

5. The display substrate according to claim 4, wherein the display substrate further comprises a plurality of gate leads provided on the base substrate, and the plurality of gate leads are electrically connected to the gate electrodes of the thin film transistors of the plurality of sub-pixels, respectively, and
wherein the plurality of gate leads and the gate electrode or the source and drain electrodes are provided in a same layer,
the plurality of gate leads extend to the peripheral area, and at least a portion of the gate leads in the peripheral area is located between the first common voltage line and the second common voltage line.

6. The display substrate according to claim 4, wherein the plurality of touch electrodes are located on a side of the pixel driving circuit away from the base substrate, and the plurality of touch electrodes and the plurality of third common voltage lines are provided in a same layer.

7. The display substrate according to claim 6, wherein the thin film transistor further comprises an active layer, the active layer does not overlap with the plurality of touch electrodes and the plurality of third common voltage lines in a direction perpendicular to the base substrate.

8. The display substrate according to claim 4, further comprising:
a ground line provided in the peripheral area, the ground line being located on a side of the second common voltage line away from the display area and at least partially surrounding the display area, and the ground line and the gate electrode are provided in a same layer.

9. The display substrate according to claim 8, further comprising:
a test line provided in the peripheral area, the test line being located on a side of the ground line away from the display area and being located on a second side of the display area opposite to the first side of the display area, and the test line and the gate electrode are provided in a same layer.

10. The display substrate according to claim 1, wherein each display signal is a DC voltage, and each touch signal is an impulse voltage, and the DC voltage comprises a first DC voltage signal, the impulse voltage has a maximum potential and a minimum potential, and the first DC voltage signal has a potential higher than the maximum potential.

11. The display substrate according to claim 10, wherein the DC voltage further comprises:
a second DC voltage signal, the first DC voltage signal has a potential higher than a potential of the second DC voltage signal, and
a potential of the second DC voltage signal is lower than the minimum potential.

12. The display substrate according to claim 1, wherein the first common voltage line comprises a first connection end and a second connection end, and the second common voltage line comprises a third connection end and a fourth connection end,
wherein the first connection end is electrically connected to the third connection end, and the second connection end is electrically connected to the fourth connection end, so that the first common voltage line is electrically connected to the second common voltage line.

13. The display substrate according to claim 12, wherein the integrated circuit comprises a first binding end and a second binding end disposed with a spacing and a third binding end and a fourth binding end disposed with a spacing, the first binding end is electrically connected to the third binding end, the second binding end is electrically connected to the fourth binding end;
wherein the first connection end is electrically connected to the first binding end, the third binding end is electrically connected to the third connection end, the second connection end is electrically connected to the second binding end, the fourth binding end is electrically connected to the fourth connection end so that the first common voltage line is electrically connected to the second common voltage line.

14. The display substrate according to claim 13, further comprising:
a circuit board provided in the peripheral area and at least partially provided on a side of the integrated circuit away from the display area,
wherein the third connection end and the fourth connection end are electrically connected to the third binding end and the fourth binding end via the circuit board, respectively.

15. The display substrate according to claim 13, wherein the integrated circuit comprises a first sub-integrated circuit and a second sub-integrated circuit provided in parallel on a first side of the display area,
wherein the first binding end and the third binding end are provided at an end of the first sub-integrated circuit away from the second sub-integrated circuit, and the second binding end and the fourth binding end are provided on a side of the second sub-integrated circuit away from the first sub-integrated circuit.

16. The display substrate according to claim 15, wherein the first sub-integrated circuit further comprises a fifth binding end provided at an end of the first sub-integrated circuit near the second sub-integrated circuit, and the second sub-integrated circuit further comprises a sixth binding end provided at an end of the second sub-integrated circuit near the first sub-integrated circuit,
wherein the fifth binding end and the sixth binding end are inputted with the display signals during the display stage, and are inputted with the touch signals during the touch stage, and the fifth binding end and the sixth binding end are floatingly provided.

17. The display substrate according to claim 15, wherein the first sub-integrated circuit further comprises a plurality of seventh binding ends provided between the first binding end and the fifth binding end, and the second sub-integrated circuit further comprises a plurality of eighth binding ends provided between the second binding end and the sixth binding end,
wherein the plurality of third common voltage lines are electrically connected to the plurality of seventh binding ends and the plurality of eighth binding ends, respectively.

18. The display substrate according to claim 1, wherein the first common voltage line and the second common voltage line surround the display area at least on a second side, a third side, and a fourth side of the display substrate, and are electrically connected to the integrated circuit at least on the first side of the display area,
wherein the first side is opposite to the second side, and the third side is opposite to the fourth side.

19. The display substrate according to claim 1, wherein the first common voltage line and the second common voltage line are in grid shapes, respectively.

20. A display device comprising:
the display substrate according to claim 1,
an opposite substrate that is opposite to the display substrate, and a liquid crystal layer located between the display substrate and the opposite substrate.

* * * * *